United States Patent [19]

Ohsawa et al.

[11] 4,100,500
[45] Jul. 11, 1978

[54] ANGLE-MODULATION DETECTOR HAVING PUSH-PULL INPUT APPLIED THROUGH HIGH-PASS FILTERS

[75] Inventors: Mitsuo Ohsawa, Fujisawa; Yukio Onoe; Hiroshi Yamagishi, both of Tokyo, all of Japan

[73] Assignee: Sony Corporation, Tokyo, Japan

[21] Appl. No.: 827,797

[22] Filed: Aug. 25, 1977

[30] Foreign Application Priority Data

Aug. 27, 1976 [JP] Japan .............................. 51-103053

[51] Int. Cl.² .............................................. H03D 3/14
[52] U.S. Cl. .................................. 329/103; 325/347; 325/349; 329/133; 329/134; 329/138
[58] Field of Search ............... 329/103, 110, 112, 133, 329/134, 137, 138, 145; 325/347, 349

[56] References Cited

U.S. PATENT DOCUMENTS

| 3,548,326 | 7/1967 | Bilotti | 329/134 X |
| 3,667,060 | 5/1972 | Avins | 329/103 |
| 3,866,125 | 2/1975 | Kilian | 329/137 X |

Primary Examiner—Siegfried H. Grimm
Attorney, Agent, or Firm—Lewis H. Eslinger; Alvin Sinderbrand

[57] ABSTRACT

A circuit adapted to detect an angle-modulated signal including a pair of terminals to which the angle-modulated signal is supplied in push-pull relation and a high-pass filter circuit coupled to the pair of terminals for transmitting those frequencies of the angle-modulated signal which exceed a cut-off frequency. A differential amplifier has a pair of inputs coupled to the high-pass filter circuit to receive the filtered angle-modulated signal as a reference signal and a quadrature generator is coupled to the high-pass filter circuit and is responsive to the filtered reference signal for generating a quadrature signal whose phase varies with respect to the reference signal as a function of the change in frequency of the reference signal. A multiplier is coupled to the differential amplifier outputs and includes an input for receiving the quadrature signal so as to be switched in response to these respective signals for producing an output signal which is a function of the phase difference between the reference and quadrature signals.

16 Claims, 3 Drawing Figures

ANGLE-MODULATION DETECTOR HAVING PUSH-PULL INPUT APPLIED THROUGH HIGH-PASS FILTERS

BACKGROUND OF THE INVENTION

This invention relates to a circuit which is readily adapted to detect an angle-modulated signal and, more particularly, to a quadrature-type phase detector which is operative as an FM detector and which exhibits superior AM suppression characteristics. The circuit of this invention advantageously can be fabricated as an integrated circuit.

A quadrature-type phase detector generally is a switching or gating circuit which, when supplied with amplitude-limited angle-modulated signals, such as a frequency modulated (FM) signal, is capable of detecting the information signal which was used to modulate the angle-modulated signal. One advantageous use of a quadrature-type phase detector is as an FM detector.

One example of a typical prior art quadrature type phase detector is described in U.S. Pat. No. 3,548,326 to Bilotti. In this patented circuit, a plural-stage amplifier limiter is supplied with an FM signal and produces an amplitude-limited version of that FM signal. The limited FM signal is supplied as a reference signal to one input of a detector stage. This same amplitude-limited FM signal also is supplied through a phase shifter, so as to be shifted by 90°, to a pair of switching stages, such as gating circuits, included in the detector stage. The phase of the 90° phase-shifted reference signal, which is the quadrature signal, differs in phase with respect to the reference signal in accordance with the frequency modulation of the input signal. The currents flowing through the gating circuits of the detector stage are determined by the conductivity of differentially connected transistors, the latter being driven by the reference signal. Consequently, the outputs of the respective gating circuits are current pulses having respective durations which are proportional to the phase difference between the quadrature signal and the reference signal. These pulse durations are integrated so as to provide an amplitude envelope proportional to the original information signal which was used as the frequency-modulating signal.

One problem which is found with this prior art circuit is the apparent requirement that the plural-stage amplifier limiter is direct-coupled to the detector stage. This means that any DC drift in the amplifier limiter is coupled directly to the detector stage, resulting in an undesired DC drift in the latter stage, thereby causing the overall circuit to be unstable. Furthermore, because of this direct-coupling between the amplifier limiter and the detector stage, if the amplitude of the reference signal changes because of the operation of the amplifier limiter, the resultant amplitude modulated (AM) component will not be adequately suppressed, thereby producing errors in the output signal produced by the detector stage. Stated otherwise, the suppression ratio in this prior art circuit is not of a desirably high value because of the direct coupling between the amplifier limiter and the detector stage.

OBJECTS OF THE INVENTION

Therefore, it is an object of the present invention to provide an improved detector circuit which overcomes the aforenoted problems found in the prior art circuit.

Another object of this invention is to provide an improved circuit which is readily adapted to operate as a quadrature-type phase detector.

A further object of this invention is to provide an improved quadrature-type phase detector in which the possibility of DC drift in the limiter amplifier stage is not coupled to the detector stage.

An additional object of this invention is to provide a quadrature-type phase detector having a desirably high AM suppression ratio.

Yet another object of this invention is to provide an improved circuit which is readily adapted to detect an angle-modulated signal and which is suited for fabrication as an integrated circuit.

Various other objects, advantages and features of this invention will become readily apparent from the ensuing detailed description, and the novel features will be particularly pointed out in the appended claims.

SUMMARY OF THE INVENTION

In accordance with this invention, a circuit is provided which is readily adapted to detect an angle-modulated signal, such as an FM signal. This circuit includes a pair of terminals to which the angle-modulated signal is supplied in push-pull relation, and a high-pass filter circuit is coupled to the pair of terminals for filtering only those frequencies of the angle-modulated signal which exceed a cut-off frequency. The filtered angle-modulated signal is supplied as a reference signal to a pair of inputs of a differential amplifier, and the filtered reference signal also is supplied to a quadrature generator which generates a quadrature signal in response thereto, the phase of the quadrature signal varying with respect to the reference signal as a function of a change in frequency of the reference signal. A multiplier circuit is responsive both to the reference signal, as amplified by the differential amplifier, and the quadrature signal so as to produce an output signal which is a function of the phase difference between the reference and quadrature signals.

BRIEF DESCRIPTION OF THE DRAWINGS

The following detailed description, given by way of example, will best be understood in conjunction with the accompanying drawings in which.

DETAILED DESCRIPTION OF A PREFERRED EMBODIMENT

Figure 1:
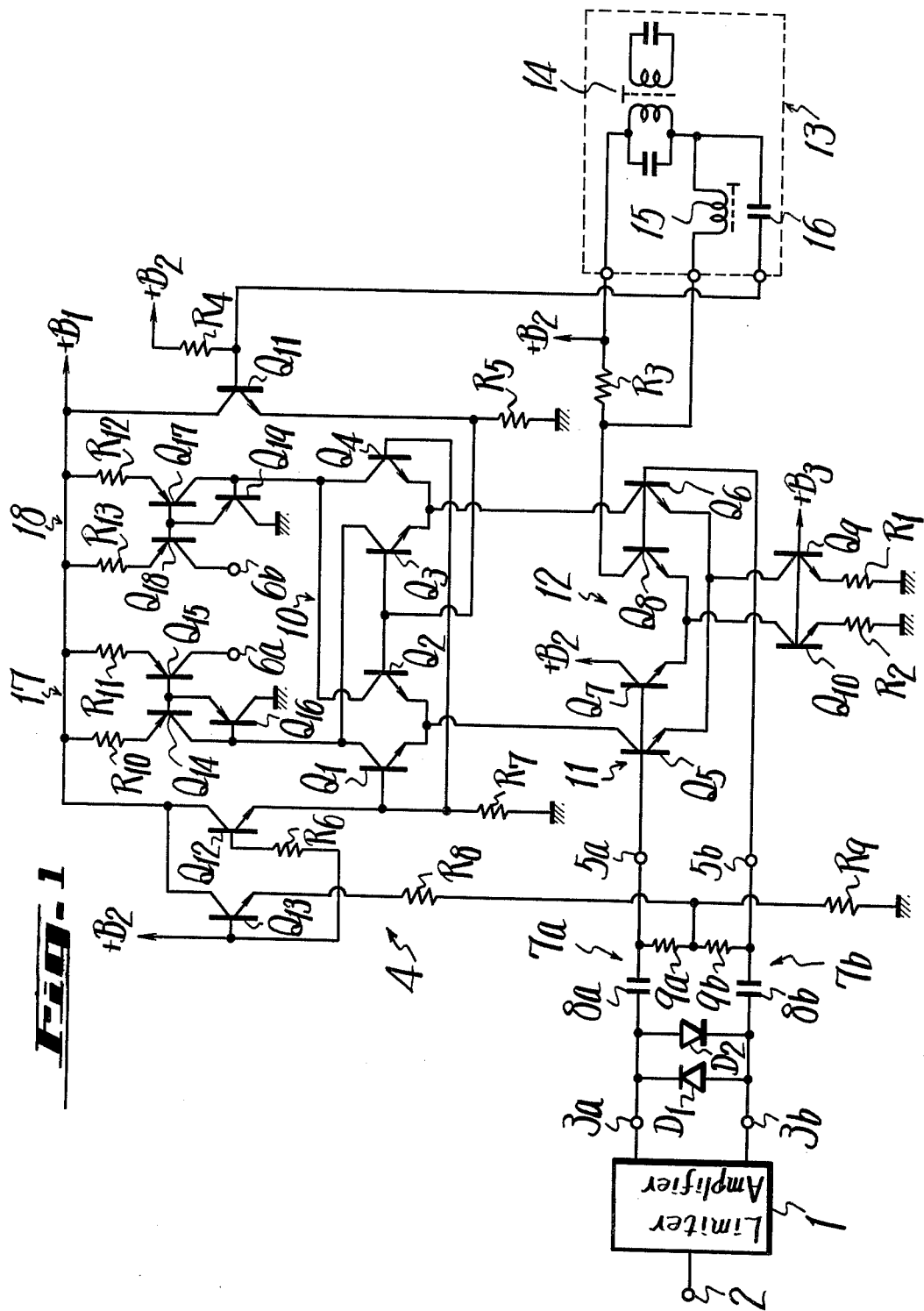
FIG. 1 is a schematic diagram of a preferred embodiment of the present invention.

Referring now to the drawings, and in particular to FIG. 1, the circuit illustrated therein is readily adapted to detect an angle-modulated signal, such as a frequency-modulted (FM) signal or a phase-modulated (PM) signal. For the purpose of the present discussion, it will be assumed that the angle-modulated signal is an FM signal; but it is recognized that this circuit is adapted for operation to detect phase-modulated signals as well. The illustrated circuitry includes a limiter amplifier 1, a detector 4 and a high-pass filter circuit formed of high-pass filters 7a and 7b. Limiter amplifier 1 includes an input terminal 2 adapted to receive an FM signal. Typically, the FM signal is applied to input terminal 2 from the intermediate frequency (IF) stage of an FM receiver. Hence, the IF carrier frequency generally is about 10.7 MHz. The limiter amplifier preferably includes plural amplifying stages and is stabilized by providing a negative DC feedback circuit. As one example thereof, limiter amplifier 1 may be similar to the plural stage limiter amplifier described in aforenoted U.S. Pat. No. 3,548,326. As an alternative, limiter amplifier 1 may include capacitance-coupled stages.

The output of limiter amplifier 1 is an amplitude-limited FM signal, this signal being applied in push-pull relation to terminals 3a and 3b, respectively. As is appreciated, the amplitude limited FM signals applied to these terminals are of opposite phase and, in one embodiment, exhibit substantially equal positive DC components. As a numerical example, the output impedance of limiter amplifier 1, as viewed from terminal 3a, is about 800 ohms, and the same output impedance of this limiter amplifier is viewed from terminal 3b.

Detector 4, which may be capable of various modes of operation, will be described herein as a quadrature-type phase detector adapted to detect the information signal which is represented as the frequency modulations of the IF carrier supplied to input terminal 2. Detector 4 is provided with a pair of inputs 5a and 5b for receiving the amplitude limited FM signal supplied to terminals 3a and 3b, respectively. The aforementioned high-pass filter circuit is coupled between terminals 3a, 3b and inputs 5a, 5b. As shown, this high-pass filter circuit is comprised of high-pass filters 7a and 7b, each consisting of a capacitor 8a, 8b connected in series with a resistor 9a, 9b, respectively. The resistors also are connected in series with each other. Input 5a is connected to the junction defined by capacitor 8a and resistor 9a, and input 5b is connected to the junction defined by capacitor 8b and resistor 9b. The cut-off frequency of each high-pass filter, that is, the frequency below which substantial signal attenuation is achieved, is determined by the capacitance and resistance of the high-pass filter, together with the input impedance of detector 4. Still further, since the output impedance of limiter amplifier 1 is in series with high-pass filters 7a and 7b, as viewed from terminals 3a and 3b, respectively, the cut-off frequency also is influenced by this output impedance. Preferably, the capacitance of capacitors 8a and 8b and the resistance of resistors 9a and 9b are selected such that the cut-off frequency of high-pass filters 7a and 7b is in the vicinity of the center, or carrier frequency of the FM signals supplied to terminals 3a and 3b. Since the FM signal carrier at terminals 3a and 3b is assumed to be the IF carrier having a frequency of 10.7 MHz, the cut-off frequency of the high-pass filters may be in the range of from 0.5 to 1.2 times this center or carrier frequency. As an example, the capacitance of capacitors 8a and 8b may be 5 pF and the resistance of resistors 9a and 9b may be 2 Kohms.

To provide an additional amplitude limiting function, oppositely-poled diodes D1 and D2 are connected across terminals 3a and 3b, as shown. Hence, the maximum amplitude of the FM signals applied from terminals 3a, 3b to high-pass filters 7a, 7b is limited to the diode voltage of these respective diodes.

Quadrature-type phase detector 4 is comprised of a multiplier circuit 10, a differential amplifier 11, a phase shifter 13 and a bias generator for generating various DC bias voltages which are applied to the multiplier circuit and to the differential amplifier. Differential amplifier 11 is formed of transistors Q5 and Q6 whose emitter electrodes are connected in common to a constant current source formed of transistor Q9, the emitter electrode of the constant current source transistor being coupled to a reference potential, such as ground, by a resistor R1. The base electrode of transistor Q5 is coupled to input 5a and the base electrode of transistor Q6 is coupled to input 5b. Hence, the amplitude limited FM signal is supplied as a reference signal in push-pull relation, or differentially, to transistors Q5 and Q6 after being filtered by high-pass filters 7a and 7b, respectively. A DC bias voltage is applied to the base electrodes of transistors Q5 and Q6, which electrodes serve as a pair of inputs to differential amplifier 11, from a DC bias generator formed of transistor Q13 and resistors R8 and R9. In particular, transistor Q13 is connected such that its base electrode is coupled to a source of operating potential +B2 which, for example, may be derived from a suitable power supply and may exhibit a voltage of 6.2 volts. The collector electrode of transistor Q13 is coupled to a source of operating potential +B1 which, for example, may be 12 volts, and the emitter electrode of this transistor is coupled through series-connected resistors R8 and R9 to ground. The base-emitter junction of transistor Q13 and resistors R8 and R9 functions as a voltage divider to derive a bias voltage at the junction defined by resistors R8 and R9. This bias voltage is supplied to the junction defined by resistors 9a and 9b of high-pass filters 7a and 7b, respectively, and is supplied through these resistors to the inputs of differential amplifier 11.

The collector electrodes of transistors Q5 and Q6 of differential amplifier 11 function as a pair of outputs for this differential amplifier and are connected to multiplier 10. In particular, and as shown in FIG. 1, multiplier 10 is formed of a pair of transistors Q1 and Q2 whose emiter electrodes are connected in common to the collector electrode of transistor Q5, and a pair of transistors Q3 and Q4 whose emitter electrodes are connected in common to the collector electrode of transistor Q6. Thus, the currents flowing through transistors Q1 and Q2 are determined, in part, by the conductivity of transistor Q5 of differential amplifier 11; and the currents flowing through transistors Q3 and Q4 are determined, in part, by the conductivity of transistor Q6 of this differential amplifier.

The base electrodes of transistors Q2 and Q3 are connected in common and are adapted to receive a quadrature signal. As will be described below, this quadrature signal is derived by shifting the phase of the reference signal applied to differential amplifier 11 by 90°. The base electrodes of transistors Q1 and Q4 also are connected in common and are adapted to receive a DC bias voltage which is generated by the combination of transistor Q12 and resistors R6 and R7. As shown, resistor R6 couples the base electrode of transistor Q12 to source +B2, and the emitter electrode of transistor Q12 is connected to the base electrodes of transistors Q1 and Q4. Resistor R6, the base-emitter junction of transistor Q12 and resistor R7 function as a voltage divider, with resistor R7 coupling the emitter electrode of transistor Q12 to ground. As shown, the collector electrode of transistor Q12 is connected to source +B1.

The collector electrodes of transistors Q1 and Q3 are connected in common to a current mirror circuit 17; and the collector electrodes of transistors Q2 and Q4 also are connected in common to a current mirror circuit 18. These current mirror circuits are of similar construction and each is connected to a respective output terminal 6a and 6b, these output terminals corresponding to the outputs of the illustrated detector circuit. As is known, a current mirror circuit is adapted to supply a current to its output terminal which is substantially identical to the current which flows therethrough. In this manner, an output current may be produced which is not influenced by any load which may be coupled to the output terminal. Current mirror circuit 17 is comprised of transistors Q14 and Q15 whose base electrodes are connected in common and whose emitter electrodes are connected via resistors R10 and R11, respectively, to source +B1. A DC feedback path is provided from the collector electrode of transistor Q14 to the base electrode thereof, this feedback path comprising the base-emitter junction of the transistor Q16. As shown, the collector electrode of transistor Q16 is coupled to ground.

Current mirror circuit 18 is formed of transistors Q17, Q18 and Q19 and is of similar construction to current mirror circuit 17. Hence, in the interest of brevity, further description of current mirror circuit 18 is not provided. It is noted that in both current mirror circuits, each transistor is a PNP transistor. Referring again to current mirror circuit 17, the collector electrode of transistor Q14 is connected to the collector electrode of transistor Q1; and the collector electrode of transistor Q15 is connected to output terminal 6a. Hence, the current which flows to output terminal 6a through transistor Q15 is substantially identical to the current which flows through the emitter-collector circuit of transistor Q14 to the common-connected collector electrodes of transistors Q1 and Q3. Similarly, the current which flows through transistor Q18 to output terminal 6b is substantially identical to the current which flows through the emitter-collector circuit of transistor Q17 and to the common-connected collector electrodes of transistors Q2 and Q4.

Phase shifter 13 is comprised of a resonant LC circuit 14 connected in series between source +B2 and a choke coil 15, the latter being adapted to receive an amplified reference signal. Resonant LC circuit 14 may be a complex tuning circuit such that phase shifter 13 is adapted to impart a phase shift of 90° 93 to the reference signal when the frequency of the reference signal is equal to its center or carrier frequency. As discussed above, this center frequency is the IF carrier of 10.7 MHz. The resultant quadrature signal generated by phase shifter 13 is coupled via a capacitor 16 to an emitter-follower transistor Q11 for application to the common-connected base electrodes of transistors Q2 and Q3. More particularly, a bias voltage is supplied from source +B2 via a resistor R4 to the base electrode of transistor Q11. The collector electrode of this transistor is connected to source +B1, and its emitter electrode is coupled to ground by a resistor R5. The emitter electrode of transistor Q11, from which the quadrature (i.e., 90° phase-shifted) signal is derived, is connected to the base electrodes of transistors Q2 and Q3.

The reference signal which is applied to phase shifter 13 is supplied thereto by a further differential amplifier 12 formed of transistors Q7 and Q8 whose emitter electrodes are connected in common to a current source transistor Q10 and whose base electrodes are connected to inputs 5a and 5b, respectively, to which the amplitude limited, filtered FM signal is applied. The collector electrode of transistor Q7 is connected directly to source +B2, and the collector electrode of transistor Q8 is connected via a load resistor R3 to source +B2. The base electrode of current source transistor Q10 is connected in common with the base electrode of aforedescribed current source transistor Q9 to a source of potential +B3. The emitter electrode of current source transistor Q10 is coupled to ground via a resistor R2.

When the illustrated detector circuit 4 is fabricated as an integrated circuit, it is apparent that phase shifter 13 is connected to this integrated circuit externally.

In operation, an FM signal is applied to input terminal 2. This FM signal is amplitude limited by limiter amplifier 1 and by diodes D1 and D2. The resultant amplitude limited FM signal is applied in push-pull relation to terminals 3a and 3b. High-pass filters 7a and 7b filter the higher frequency components of this amplitude limited FM signal and supply the filtered, amplitude-limited FM signal as a reference signal to differential amplifiers 11 and 12. The amplified reference signal is applied by the pair of outputs of differential amplifier 11 to the common-connected emitter electrodes of transistors Q1, Q2 and transistors Q3, Q4, respectively. Thus, since transistors Q5 and Q6 are rendered conductive during alternate half-cycles of the reference signal, during one half-cycle transistors Q1 and Q2 may be conductive and during the other half-cycle transistors Q3 and Q4 may be conductive.

Differential amplifier 12 amplifies the reference signal applied thereto via inputs 5a and 5b and supplies this amplified reference signal to phase shifter 13. The phase shifter produces a quadrature signal whose phase varies with respect to the phase of the reference signal as a function of the change in frequency of the reference signal. That is, the phase of the quadrature signal changes relative to the reference signal in accordance with the frequency modulations of the reference signal. Consequently, this changing phase difference between the quadrature and reference signals is proportional to the signal information which modulates the FM carrier.

The phase-varying quadrature signal is supplied from phase shifter 13 through emitter-follower transistor Q11 to transistors Q2 and Q3, while a bias voltage is supplied to transistors Q1 and Q4. Since the frequency of the reference signal amplified by differential amplifier 11 and the frequency of the quadrature signal are equal, it is seen that, while transistor Q5 is conductive, transistor Q2 (and also transistor Q1) is conductive for a duration which is a function of the phase difference between the quadrature signal and the reference signal. Similarly, for the duration that transistor Q6 is conductive, transistor Q3 (and also transistor Q4) is conductive for a duration which is a function of the phase difference between the reference and quadrature signals. Therefore, the current flowing through the common-connected collector electrodes of transistors Q1 and Q3, that is, the current flowing through current mirror circuit 17, is proportional to the phase difference between the reference signal and the quadrature signal, and since this phase difference is a function of the frequency modulations of the reference signal, the current flowing through current mirror circuit 17 represents the modulating information signal. Similarly, the current flowing through current mirror circuit 18 also represents the modulating information signal, but this current is of opposite phase to the current flowing through current mirror circuit 17. Thus, output terminals 6a and 6b are provided with detected or demodulated signals.

Figure 2:
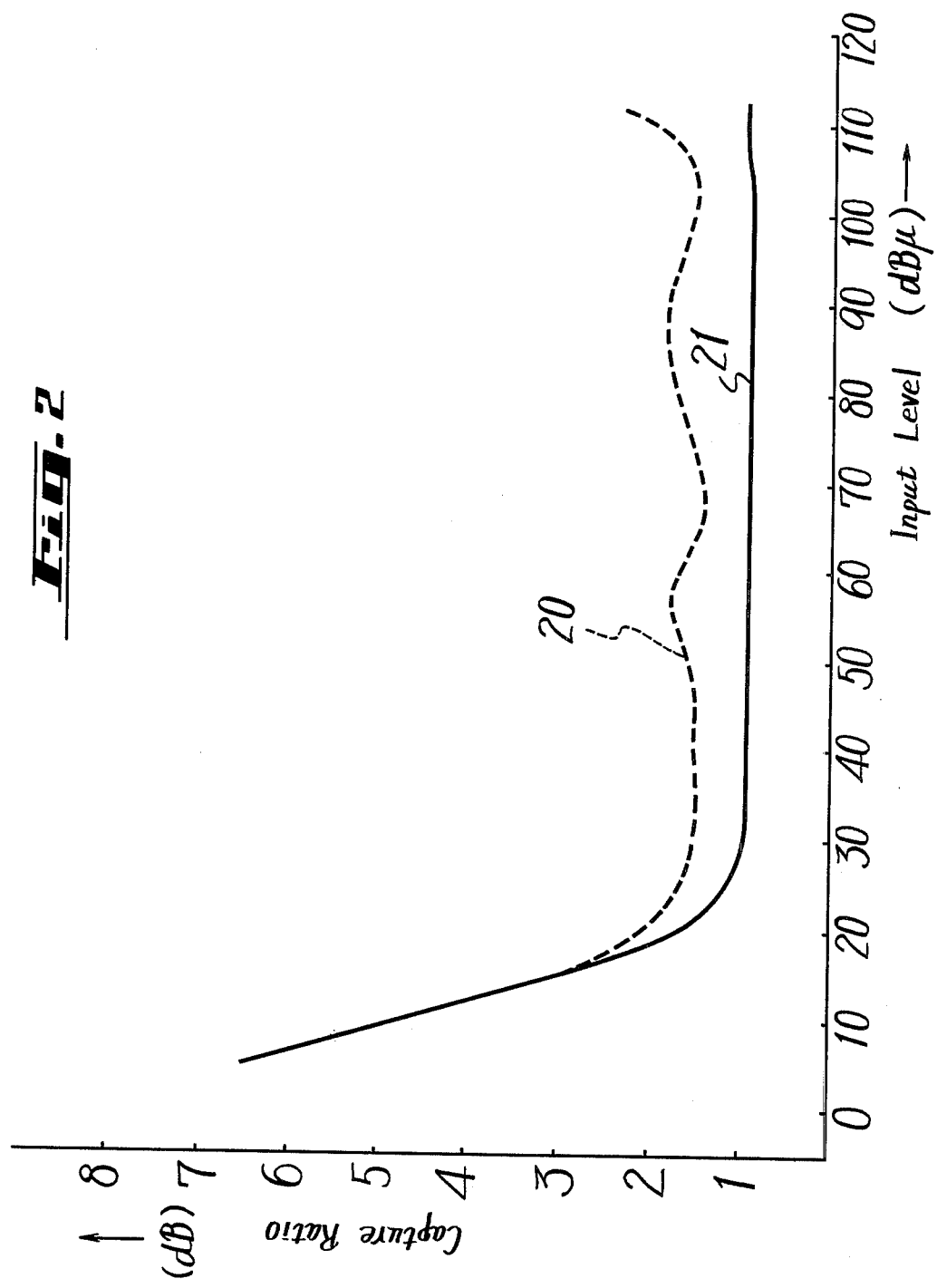
FIG. 2 is a graphical representation of the improved capture ratio achieved by the circuit shown in FIG. 1.

The improved performance achieved by the detector circuit shown in FIG. 1 over prior art detector circuits is illustrated graphically in FIG. 2 wherein the ordinate represents the capture ratio and the abscissa represents the input signal level. Broken curve 20 represents the capture ratio characteristic of a prior art quadrature-type phase detector and the characteristic curve 21 shown as a solid line represents the improved capture ratio characteristic of the quadrature-type phase detector described above with respect to FIG. 1. As shown by curve 21, the capture ratio of the circuit shown in FIG. 1 is substantially constant over a substantial range of input signal level, and this capture ratio desirably is lower than that of prior art quadrature-type phase detectors.

Figure 3:
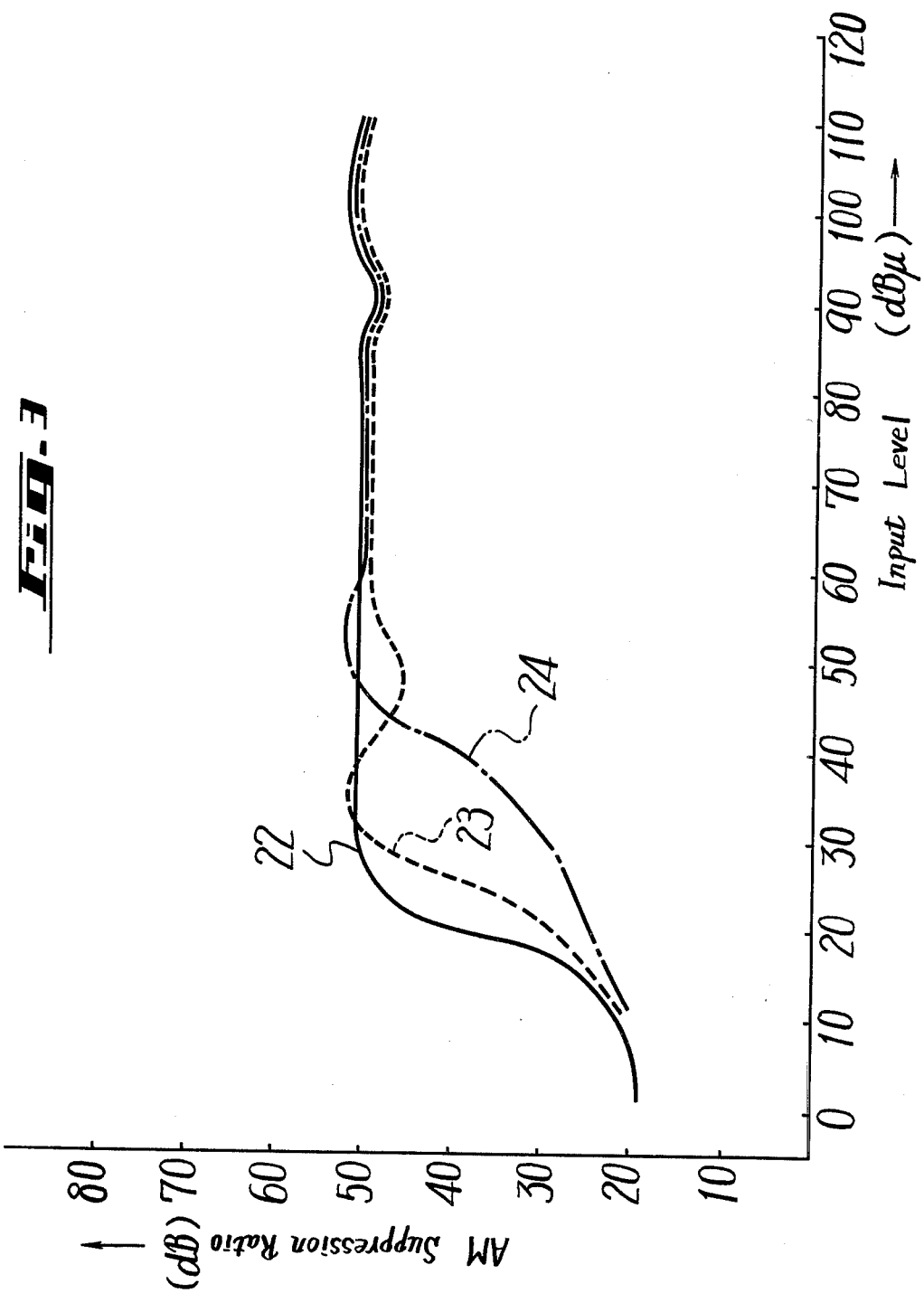
FIG. 3 is a graphical representation of the improved AM suppression ratio which is achieved by the circuit shown in FIG. 1.

Another example of improved performance achieved by the circuit shown in FIG. 1 is represented in FIG. 3 which graphically depicts the AM suppression ratio as a function of input signal level. Three curves 22, 23 and 24 are drawn for three different values of the high-pass filter cut-off frequency. in particular, curve 22 is drawn for the embodiment wherein capacitors 8a and 8b each are of 5 to 6 pF, curve 23 is drawn for the embodiment wherein these capacitors each are 3 pF; and curve 24 is drawn for the embodiment wherein these capacitors each are 10 pF. In each embodiment, resistors 9a and 9b each are 2 Kohms. Furthermore, these curves are drawn for the condition wherein the FM carrier, or center frequency of the FM signal, is equal to the IF carrier frequency of 10.7 MHz. The frequency of the information signal which modulates the carrier is equal to 400 Hz, the frequency of the AM component (which may be thought of as a jamming or interfering signal) is equal to 1 KHz and the modulation factor is equal to 30% (with 100% modulation having a frequency swing of 75 KHz). As may be observed from FIG. 3, curve 22, which is drawn for the embodiment wherein capacitors 8a and 8b each is 5 to 6 pF, represents the best of the illustrated AM suppression ratio characteristics.

In a high-pass filter, the cut-off frequency is determined approximately by $\omega = 1/RC$, wherein C is the capacitance of the high-pass filter and R is the resistance thereof. For high-pass filter 7a wherein the output impedance of limiter amplifier 1 when viewed from terminal 3a is equal to $Z_o$ in series with the high-pass filter, the cut-off frequency may be expressed as:

$$f_C = \frac{1}{2\pi C8a(R9a + Z_o)}$$

If the capacitance C8a of capacitor 8a is equal to 6 pF, then the cut-off frequency $f_c$ is about 9.5 MHz.

Since high-pass filters 7a and 7b are connected in series between limiter amplifier 1 and detector 4, capacitors 8a and 8b, which are connected in series between terminal 3a and detector 4 and between terminal 3b and detector 4, respectively, block any DC current which may be produced by the limiter amplifier from reaching the detector. Hence, the high-pass filter circuit serves as a DC and low frequency isolating circuit to prevent detector 4 from being influenced by a possible DC drift in limiter amplifier 1 and for preventing the detector circuit from being influenced by undesired low frequency signals. This stabilizes the operating points of the quadrature-type phase detector, thus making these operating points uniform from one detector to the next. Hence, the detecting characteristics of the illustrated quadrature-type phase detector are improved over that of the prior art.

Furthermore, by providing the high-pass filter circuit, amplitude fluctuations in the FM signal which may be caused by, for example, operating limiter amplifier 1 in its saturation region, does not vary the capture ratio characteristic or the AM suppression ratio characteristic or the signal detection characteristic of the illustrated detector. Because of the improved AM suppression ratio, an AM component which may be imparted to the FM signal by limiter amplifier 1 does not significantly influence the operation of the quadrature-type phase detector.

It is preferred that different differential amplifiers 11 and 12 be provided for supplying the reference signal to multiplier 10 and for supplying the reference signal to phase shifter (or quadrature generator) 13, respectively. By using these separate differential amplifiers, interference between the reference and quadrature signals is avoided.

While the illustrated circuit exhibits superior capture ratio, AM suppression ratio and information signal detection characteristics, these characteristics can be further improved if the bias potentials which are applied to the limiter amplifier and to detector 4 are stabilized.

While the present invention has been particularly shown and described with respect to a preferred embodiment thereof, and particularly with respect to a preferred application, it should be readily apparent that various changes in form and details may be made by one of ordinary skill in the art without departing from the spirit and scope of this invention. For example, with suitable bias potentials applied to differential amplifier 11 and to multiplier 10, detector 4 may be operated to perform a synchronous detecting operation. In that mode of operation, a suitable circuit may be used to derive the carrier or center frequency of the FM signal. Furthermore, since transistors Q1, Q2 and transistors Q3, Q4 of multiplier 10 function as switching or gating circuits, the illustrated detector may be operated under special conditions as a balanced modulator.

As one example of preferred values for some components, the following are provided:

| | |
|---|---|
| 8a, 8b ... | 5 to 6 pF; 3 pF; 10 pF |
| 9a, 9b ... | 2 Kohms |
| R1 ... | 600 ohms |
| R2 ... | 600 ohms |
| R3 ... | 390 ohms |
| R4 | 5 Kohms |
| R5 | 10 Kohms |
| R6 | 5 Kohms |
| R10 | 680 ohms |
| R11 | 680 ohms |
| R12 | 680 ohms |
| R13 | 680 ohms |
| B1 ... | 12 volts |
| B2 ... | 6.2 volts |

It is appreciated that the foregoing values may vary, as desired; and it is intended that the appended claims be interpreted as including the foregoing values as well as other contemplated values, and also the foregoing and other similar changes and modifications in form and details which may be made to this invention.

What is claimed is:

1. A circuit adapted to detect an angle-modulated signal, comprising:
   input means having a pair of terminals for supplying an angle-modulated signal to said pair of terminals in push-pull relation;
   high-pass filter means coupled to said pair of terminals for transmitting that portion of said supplied angle-modulated signal which exceeds a cut-off frequency, said high-pass filter means being formed of resistance means and capacitance means;

a differential amplifier having a pair of inputs coupled to said high-pass filter means for receiving the transmitted angle-modulated signal as a reference signal, said reference signal being applied to said pair of inputs in push-pull relation, and said differential amplifier having a pair of outputs;

quadrature generating means responsive to said reference signal for generating a quadrature signal whose phase varies with respect to said reference signal as a function of a change in frequency of said reference signal;

coupling means for coupling said reference signal to said quadrature generating means; and multiplier means coupled to said pair of outputs of said differential amplifier for receiving output signals produced by said differential amplifier in response to said reference signal applied thereto, said multiplier means also being coupled to said quadrature generating means for receiving said quadrature signal to produce an output signal as a function of the phase difference between said reference and quadrature signals.

2. The circuit of claim 1 wherein said high-pass filter means comprises a pair of high-pass filters coupled to said pair of terminals, respectively, each high-pass filter consisting of a capacitor in series with a resistor, the junctions formed by the respective resistors and capacitors being coupled to said pair of inputs, respectively, of said differential amplifier, and the resistors of said high-pass filters being connected in series with each other.

3. The circuit of claim 2 wherein each of said high-pass filters has a cut-off frequency within the range of 0.5 to 1.2 times the carrier frequency of said supplied angle-modulated signal.

4. The circuit of claim 2 wherein each of said high-pass filters has a cut-off frequency that is substantially equal to the center frequency of said reference signal.

5. The circuit of claim 2 further comprising bias means coupled to the junction formed by the series-connected resistors of said high-pass filters to supply bias voltages through said resistors to said inputs of said differential amplifier.

6. The circuit of claim 1 wherein said quadrature generating means comprises a phase shifter for imparting to said reference signal a phase shift of 90° at the center frequency of said reference signal; and wherein said coupling means comprises a second differential amplifier having a pair of inputs for receiving said reference signal in push-pull relation and an output coupled to said phase shifter.

7. The circuit of claim 6 wherein said phase shifter comprises a resonant LC circuit connected in series with a choke coil, and a capacitor for coupling the junction formed by said LC circuit and said choke coil to said multiplier means.

8. The circuit of claim 6 wherein said multiplier means comprises a first stage including a pair of transistors whose emitter electrodes are connected in common to one of the outputs of the first-mentioned differential amplifier; a second stage including a pair of transistors whose emitter electrodes are connected in common to the other output of said first differential amplifier; means coupled to said phase shifter for applying the phase-shifted reference signal to the base electrode of one transistor in each of said first and second stages; first signal output means coupled to the collector electrodes of said one transistor in said first stage and the other transistor in said second stage; and second signal output means coupled to the collector electrodes of said one transistor in said second stage and the other transistor in said first stage; whereby said first signal output means produces a first output signal proportonal to the difference in phase between said reference signal and said phase-shifted reference signal, and said second signal output means produces a second output signal substantially equal to but of opposite phase with respect to said first output signal.

9. The circuit of claim 8 wherein said means for applying the phase-shifted reference signal to said one transistor in each of said first and second stages comprises an emitter-follower transistor.

10. The circuit of claim 9 further comprising means for applying a DC bias voltage to the base electrode of the other transistor in each of said first and second stages.

11. The circuit of claim 10 wherein said means for applying a DC bias voltage comprises a source of DC voltage; and an emitter-follower transistor connected between said source and said other transistors.

12. The circuit of claim 8 wherein each of said first and second signal output means comprises a current mirror circuit for producing respective output signals proportional to the currents flowing through the one and other transistors coupled thereto.

13. The circuit of claim 12 wherein each current mirror circuit is comprised of first and second transistors whose base electrodes are connected in common and whose emitter electrodes are supplied with a DC operating potential; DC feedback means for connecting the collector electrode of said first transistor to the base electrode thereof; and means for coupling the collector electrode of said first transistor to the collector electrodes of associated one and other transistors.

14. The circuit of claim 1 further comprising a pair of oppositely poled diodes connected across said pair of terminals.

15. The circuit of claim 14 wherein said input means comprises a limiter amplifier whose output terminals comprise said pair of terminals, said limiter amplifier being operative to receive said angle-modulated signal.

16. The circuit of claim 15 wherein said angle-modulated signal is an FM signal and said circuit is operative as a quadrature-type phase detector for demodulating the received FM signal.

* * * * *